(12) United States Patent
Ohsuka et al.

(10) Patent No.: US 11,013,124 B2
(45) Date of Patent: May 18, 2021

(54) PRINTED CIRCUIT BOARD AND METHOD OF MANUFACTURING PRINTED CIRCUIT BOARD

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Ryuta Ohsuka, Osaka (JP); Koji Nitta, Osaka (JP); Shoichiro Sakai, Osaka (JP); Junichi Okaue, Shiga (JP)

(73) Assignees: SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 0 days.

(21) Appl. No.: 16/648,399

(22) PCT Filed: Jun. 25, 2018

(86) PCT No.: PCT/JP2018/023922
§ 371 (c)(1),
(2) Date: Mar. 18, 2020

(87) PCT Pub. No.: WO2019/077804
PCT Pub. Date: Apr. 25, 2019

(65) Prior Publication Data
US 2020/0260589 A1     Aug. 13, 2020

(30) Foreign Application Priority Data
Oct. 18, 2017     (JP) .............................. JP2017-201928

(51) Int. Cl.
*H05K 1/09* (2006.01)
*H05K 3/18* (2006.01)
(Continued)

(52) U.S. Cl.
CPC ............... *H05K 3/181* (2013.01); *H05K 1/09* (2013.01); *H05K 3/24* (2013.01); *H05K 3/38* (2013.01);
(Continued)

(58) Field of Classification Search
CPC ............. H05K 1/181; H05K 3/18–188; H05K 1/09–097
See application file for complete search history.

(56) References Cited

U.S. PATENT DOCUMENTS

2009/0288862 A1* 11/2009 Tamura ................ H01L 23/498
174/257

FOREIGN PATENT DOCUMENTS

JP     H09-071870     3/1997
JP     2001-168147    6/2001
(Continued)

*Primary Examiner* — Jeremy C Norris
(74) *Attorney, Agent, or Firm* — IPUSA, PLLC (57) ABSTRACT

According to one aspect of the present invention, a printed circuit board includes: an insulating base film; a conductive pattern that is partially layered on a surface side of the base film; a coating layer that is layered on a surface of a layered structure including the base film and the conductive pattern and having an opening portion that partially exposes the conductive pattern; and a tin plating layer that is layered on a surface of the conductive pattern exposed from the opening portion, wherein an average peel length of the coating layer from the conductive pattern with an inner edge of the opening portion as a base end is less than or equal to 20 μm.

3 Claims, 2 Drawing Sheets

(51) Int. Cl.
  *H05K 3/24* (2006.01)
  *H05K 3/38* (2006.01)
  *H05K 3/46* (2006.01)
(52) U.S. Cl.
  CPC ..... *H05K 3/4644* (2013.01); *H05K 2203/072* (2013.01)

(56) References Cited

FOREIGN PATENT DOCUMENTS

| | | |
|---|---|---|
| JP | 2004-103706 | 4/2004 |
| JP | 2011-066181 | 3/2011 |
| WO | 03/069967 | 8/2003 |

* cited by examiner

PRINTED CIRCUIT BOARD AND METHOD OF MANUFACTURING PRINTED CIRCUIT BOARD

TECHNICAL FIELD

The present invention relates to a printed circuit board and a method of manufacturing a printed circuit board.

The present application is based on and claims priority to Japanese Patent Application No. 2017-201928, filed on Oct. 18, 2017, the entire contents of the Japanese Patent Application are hereby incorporated herein by reference.

BACKGROUND ART

Printed circuit boards are widely used to construct electrical circuits such as electronic components. A printed circuit board typically includes a plate-like or film-like insulating substrate (base board or base film) and includes a conductive pattern that is provided on the insulating substrate. A conductive pattern typically includes a lead (terminal) portion or a land portion used to connect other printed circuit boards, electronic components, and the like.

In particular, as a technique for connecting an IC for driving a LCD (liquid crystal display panel) having a small wiring pitch to a printed circuit board, it is known that tin is plated on a lead portion of a conductive pattern of the printed circuit board and the IC for driving a LCD is connected by an eutectic reaction between the tin and gold on the terminal surface of the IC for driving a LCD (see Japanese Laid-open Patent Publication No. 2011-66181).

The printed circuit board described in the publication includes a solder resist film having an opening for exposing a land portion and is manufactured by selectively forming an electroless tin plating film on the land portion that is exposed in the opening of the solder resist film.

PRIOR ART DOCUMENT

Patent Document

[Patent Document 1] Japanese Laid-open Patent Publication No. 2011-66181

SUMMARY OF THE INVENTION

According to one aspect of the present invention, a printed circuit board includes: an insulating base film; a conductive pattern that is partially layered on a surface side of the base film; a coating layer that is layered on a surface of a layered structure including the base film and the conductive pattern and having an opening portion that partially exposes the conductive pattern; and a tin plating layer that is layered on a surface of the conductive pattern exposed from the opening portion, wherein an average peel length of the coating layer from the conductive pattern with an inner edge of the opening portion as a base end is less than or equal to 20 μm.

Also, according to another aspect of the present invention, a method of manufacturing a printed circuit board includes: a conductive patter formation step of forming a conductive pattern partially on a surface side of an insulating base film; a coating layer layering step of layering, on a surface of a layered structure including the base film and the conductive pattern, a coating layer having an opening portion that partially exposes the conductive pattern; a pre-dipping step of immersing a layered structure including the base film, the conductive pattern, and the coating layer in a room temperature electroless tin plating solution; and an electroless plating step of immersing the layered structure including the base film, the conductive pattern, and the coating layer in a heated electroless tin plating solution.

EMBODIMENT FOR CARRYING OUT THE INVENTION

Problem to Be Solved by the Present Disclosure

The printed circuit board disclosed in the above publication has a disadvantage that an electroless plating solution corrodes copper, and disconnection of a circuit easily occurs.

In view of the above, the present invention has an object to provide a printed circuit board and a method of manufacturing the same such that disconnection of a conductive pattern does not easily occur.

Effect of the Present Disclosure

In a printed circuit board according to one aspect of the present invention and a printed circuit board that is obtained by a method for manufacturing the printed circuit board, disconnection of a conductive pattern does not easily occur.

Description of Embodiments of the Present Invention

According to one aspect of the present invention, a printed circuit board includes: an insulating base film; a conductive pattern that is partially layered on a surface side of the base film; a coating layer that is layered on a surface of a layered structure including the base film and the conductive pattern and having an opening portion that partially exposes the conductive pattern; and a tin plating layer that is layered on a surface of the conductive pattern exposed from the opening portion, wherein an average peel length of the coating layer from the conductive pattern with an inner edge of the opening portion as a base end is less than or equal to 20 μm.

According to the printed circuit board, by having the average peel length of the coating layer from the conductive pattern with an inner edge of the opening portion as a base end less than or equal to the above upper limit, corrosion of the conductive pattern due to local cell action at the time of foisting the tin plating layer can be suppressed. Therefore, in the printed circuit board, disconnection of the conductive pattern does not easily occur.

It is preferable that an average thickness of the tin plating layer is less than or equal to 0.6 μm. In this way, by making the average thickness of the tin plating layer less than or equal to the above upper limit, the corrosion of the conductive pattern due to local cell action can be more reliably suppressed, and thus the disconnection of the conductive pattern can be prevented more reliably.

It is preferable that on an surface of the tin plating layer, one or more first areas formed by a tin alloy and one or more second areas formed by unalloyed tin are provided, and a total occupying area percentage of the one or more first areas in the surface of the tin plating layer is less than or equal to 90%. In this way, by providing, on the surface of the tin plating layer, the one or more first areas formed by a tin alloy and the one or more second areas formed by unalloyed tin, and having the total occupying area percentage of the one or more first areas in the surface of the tin plating layer less than or equal to the above upper limit, bonding strength by an eutectic reaction with gold on a terminal surface of an electronic component or the like can be sufficiently enhanced.

A main component of the conductive pattern is copper, the printed circuit board includes a tin copper alloy layer in which the copper of the conductive pattern is alloyed with tin of the tin plating layer, and an average thickness of the tin copper alloy layer is greater than or equal to 0.1 µm and less than or equal to 0.5 µm. In this way, by the main component of the conductive pattern being copper that is inexpensive, low electrical resistance, and enables displacement tin plating, the printed circuit board can be formed at a relatively low cost. In addition, by including the tin copper alloy layer in which the copper of the conductive pattern is alloyed with the tin of the tin plating layer and the average thickness of the tin copper alloy layer within the above range, whisker generation over time can be inhibited, and a short circuit within the pattern can be prevented.

According to another aspect of the present invention, a method of manufacturing a printed circuit board includes: a conductive patter formation step of forming a conductive pattern partially on a surface side of an insulating base film; a coating layer layering step of layering, on a surface of a layered structure including the base film and the conductive pattern, a coating layer having an opening portion that partially exposes the conductive pattern; and a pre-dipping step of immersing a layered structure including the base film, the conductive pattern, and the coating layer in a room temperature electroless tin plating solution; and an electroless plating step of immersing the layered structure including the base film, the conductive pattern, and the coating layer in a heated electroless tin plating solution.

According to the method of manufacturing a printed circuit board, by including the pre-dipping step of immersing the layered structure including the base film, the conductive pattern, and the coating layer in the room temperature electroless tin plating solution, it is possible to promote the layering of tin on the conductive pattern in the electroless plating step. As a result, peeling of the coating layer from the conductive pattern with the inner edge of the opening portion as a base end, and further, the corrosion of the conductive pattern due to local cell action can be suppressed. Therefore, the method of manufacturing a printed circuit board enables to manufacture a printed circuit board such that disconnection of the conductive pattern does not easily occur.

Here, the term "surface" means a surface on the side on which the conductive pattern is layered with reference to the base film, for convenience, and is not limited to the front/back of the printed circuit board. Also, the term "average peel length of the coating layer from the conductive pattern with the inner edge of the opening portion as a base end" means, when a plurality of cross sections perpendicular to the inner edge of the opening portion in plan view are observed by a scanning electron microscope, the average value of lengths in a range where a change of the state of the interface between the coating layer and the conductive pattern can be confirmed. It should be noted that the "inner edge of the opening portion" means, within the coating layer, an inner edge of a layer mainly expressing the function of protecting mainly the conductive pattern. Also, the term "main component" means a component whose content by mass is the largest, and means preferably a component whose content is greater than or equal to 90%, and is more preferably greater than or equal to 95%. Also, the term "room temperature" means greater than or equal to 0° C. and less than or equal to 45° C.

Details of Embodiment of the Present Invention

In the following, an embodiment of a printed circuit board according to the present invention will be described in detail with reference to the drawings.

[Printed Circuit Board]

Figure 1:
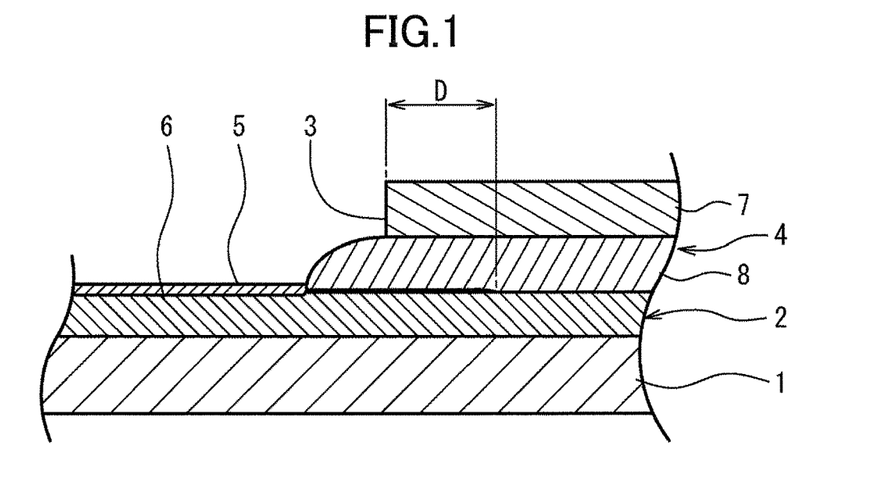
FIG. 1 is a schematic cross-sectional view illustrating a printed circuit board according to one embodiment of the present invention.

FIG. 1 illustrates a configuration of a printed circuit board according to one embodiment of the present invention. The printed circuit board includes: an insulating base film 1; a conductive pattern 2 that is partially layered on a surface side (at least one surface side) of the base film 1; a coating layer 4 that is layered on a surface of a layered structure including the base film 1 and the conductive pattern 2 and having an opening portion 3 that partially exposes the conductive pattern 2; and a tin plating layer 5 that is layered on a surface of the conductive pattern 2 exposed from the opening portion 3.

<Base Film>

It is preferable that the base film 1 is formed of a material having a synthetic resin as the main component and has flexibility. Examples of the main component of the base film 1 include a soft material such as polyimide, liquid crystal polyester, polyethylene terephthalate, polyethylene naphthalate, and fluororesin. Among these, polyimide excellent in insulation properties, flexibility, heat resistance, and the like is preferable. Also, the base film 1 may be porous, and may contain a filler, an additive, or the like.

The lower limit of the average thickness of the base film 1 is not particularly limited but is preferably 5 µm and is more preferably 12 µm. On the other hand, the upper limit of the average thickness of the base film 1 is preferably 2 mm and is more preferably 1.6 mm. In a case in which the average thickness of the base film 1 is less than the lower limit, the strength of the base film 1 may become insufficient. On the other hand, in a case in which the average thickness of the base film 1 exceeds the upper limit, the flexibility of the printed circuit board may become insufficient.

<Conduction Pattern>

The conductive pattern 2 can be formed by patterning a layer of a conductor that is layered on the base film 1. The conductive pattern 2 has a connection portion 6 to which another printed circuit board, an electronic component, or the like is connected.

Examples of the material of the conductor that forms the conductive pattern 2 include metals such as copper, silver, platinum, and nickel. Among these, copper that is relatively low cost and excellent in conductivity is preferable as the material of the conductive pattern 2.

The conductive pattern 2 is preferably formed with a substantially constant thickness. The lower limit of the average thickness of the conductive pattern 2 is preferably 2 µm, and is more preferably 5 µm. On the other hand, the upper limit of the average thickness of the conductive pattern 2 is preferably 50 µm, and is more preferably 40 µm.

In a case in which the average thickness of the conductive pattern 2 is less than the lower limit, disconnection of the conductive pattern 2 may occur. On the other hand, in a case in which the average thickness of the conductive pattern 2 exceeds the upper limit, the flexibility of the printed circuit board may decrease unnecessarily.

Typical examples of the connection portion 6 include terminals or lands to which IC terminals are connected.

<Coating Layer>

The coating layer 4 is a layer that is coated on and protects the surface of the conductive pattern 2. The opening portion 3 of the coating layer 4 is formed so as to expose the connection portion 6 of the conductive pattern 2. In the coating layer 4, an area adjacent to the inner edge of the opening portion 3 may be peeled off from the conductive pattern 2.

The coating layer 4 can be formed, for example, from a coverlay, solder resist, and the like.

The coating layer 4 illustrated in FIG. 1 is a coverlay including a protective film 7 that functions to protect the conductive pattern 2 mainly and an adhesive layer 8 that adheres the protective film 7 to the base film 1 and the conductive pattern 2.

It is preferable that the protective film 7 of the coverlay constituting the coating layer 4 is flexible and insulating. Examples of the main component of the protective film 7 include polyimide, epoxy resin, phenolic resin, acrylic resin, polyester, thermoplastic polyimide, polyethylene terephthalate, fluorine resin, liquid crystal polymer, and the like. In particular, polyimide is preferable in terms of heat resistance. It should be noted that the protective film 7 may contain other resins other than the main component, weather-resistant agents, antistatic agents, and the like.

The lower limit of the average thickness of the protective film 7 is not particularly limited, but is preferably 3 μm and is more preferably 10 μm. Also, the upper limit of the average thickness of the protective film 7 is not particularly limited, but is preferably 500 μm and is more preferably 150 μm. In a case in which the average thickness of the protective film 7 is less than the lower limit, disconnection may easily occur, especially during the manufacturing process. On the other hand, in a case in which the average thickness of the protective film 7 exceeds the upper limit, the thickness of the flexible printed circuit board may unnecessarily increase.

An adhesive that forms the adhesive layer 8 is not particularly limited, but is preferably one that is excellent in flexibility and heat resistance. Examples of such an adhesive include various resin-based adhesives such as epoxy resins, polyimides, polyesters, phenolic resins, polyurethanes, acrylic resins, melamine resins, and polyamideimides.

The lower limit of the average thickness of the adhesive layer 8 is preferably 5 μm and is more preferably 10 μm. On the other hand, the upper limit of the average thickness of the adhesive layer 8 is preferably 50 μm and is more preferably 40 μm. In a case in which the average thickness of the adhesive layer 8 is less than the lower limit described above, the adhesion strength of the coating layer 4 with respect to the conductive pattern 2 may become insufficient. On the other hand, in a case in which the average thickness of the adhesive layer 8 exceeds the upper limit, the flexible printed circuit board may become unnecessarily thick.

As the solder resist that is used for the coating layer 4, a single layer structure such as a photosensitive solder resist or a thermosetting solder resist may be used, or a dry film solder resist including a base material film and a resist layer may be used.

Examples of the main component of the solder resist (in the case of the dry film solder resist, the main component of the resist layer) include an epoxy resin, polyimide, and a silicone resin. Among these an epoxy resin, particularly an epoxy acrylate resin, is preferably used. Also, as a base film of the dry film solder resist, for example, polyimide or the like can be used.

The lower limit of the average thickness of the solder resist on the conductive pattern 2 is preferably 3 μm and is more preferably 5 μm. On the other hand, the upper limit of the average thickness of the solder resist on the conductive pattern 2 is not particularly limited, but is preferably 100 μm and is more preferably 50 μm. In case in which the average thickness of the solder resist on the conductive pattern 2 is less than the lower limit, the protection of the conductive pattern 2 may become insufficient. On the other hand, in a case in which the average thickness of the solder resist on the conductive pattern 2 exceeds the upper limit, the flexibility of the printed circuit board may become insufficient.

The upper limit of the average peel length D of the coating layer 4 from the conductive pattern 2 with the inner edge of the opening portion 3 as a base end is 20 μm, is preferably 18 μm, and is more preferably 16 μm. On the other hand, the lower limit of the average peel length D of the coating layer 4 is preferably 3 μm and is more preferably 5 μm. In a case in which the average peel length D of the coating layer 4 exceeds the upper limit, due to suppression of local battery cell action caused by the plating solution entering between the coating layer 4, peeled off at the time of forming the tin plating layer 5, and the conductive pattern 2, the conductive pattern 2 may be corroded and disconnection of the conductive pattern 2 may easily occur. On the other hand, in a case in which the average peel length D of the coating layer 4 is less than the lower limit, the thickness of the tin plating layer 5 may become insufficient as a result of excessively suppressing the peeling of the coating layer 4. It should be noted that the inner edge of the opening portion 3 means, within the coating layer 4, an inner edge of a layer mainly expressing the function of protecting mainly the conductive pattern 2, such as the protective film 7 of a coverlay, and does not refer to the adhesive layer 8 that flows into the opening portion 3 at the time of bonding as illustrated.

<Tin plating Layer>

The tin plating layer 5 is coated on the conductive pattern 2 exposed from the opening portion 3 of the coating layer 4, that is, is coated on the connection portion 6 (part of a wiring portion connected to the connection portion 6 in some cases).

By causing an eutectic reaction with gold on the surface of a terminal of another printed circuit board, an electronic component, or the like, the tin plating layer 5 enables mechanical and electrical connection between the conductive pattern 2 and an electronic component or the like easily and reliably.

The lower limit of the average thickness of the tin plating layer 5 is preferably 0.1 μm and is more preferably 0.2 μm. On the other hand, the upper limit of the average thickness of the tin plating layer 5 is preferably 0.6 μm and is more preferably 0.5 μm. In a case in which the average thickness of the tin plating layer 5 is less than the lower limit, the amount of tin that can be supplied for the eutectic reaction may become insufficient, and it may become impossible to connect the conductive pattern 2 firmly to an electronic component or the like. On the other hand, in a case in which the average thickness of the tin plating layer 5 exceeds the upper limit, the tin plating layer 5 may be fluidized at the time of the eutectic reaction to cause a short circuit at the adjacent connection portion 6.

Figure 2:
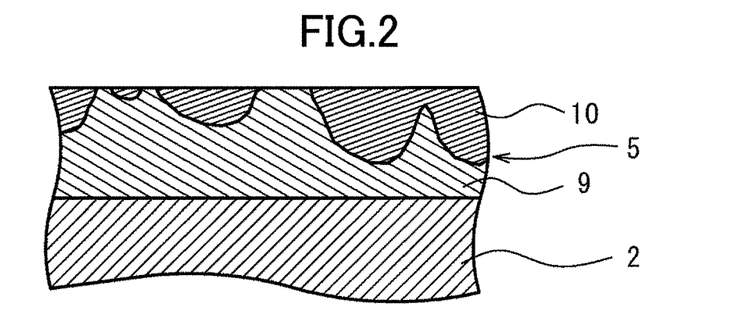
FIG. 2 is a schematic cross-sectional view of a tin plating layer of FIG. 1.

As illustrated in FIG. 2, the tin plating layer 5 preferably includes a tin copper alloy layer 9 in which the tin is alloyed with copper of the conductive pattern 2 and a pure tin layer 10 that is not alloyed. The tin copper alloy layer 9 enhances the adhesion between the conductive pattern 2 and the tin plating layer 5.

The lower limit of the average thickness of the tin copper alloy layer 9 is preferably 0.1 μm and is more preferably 0.2 μm. On the other hand, the upper limit of the average thickness of the tin copper alloy layer 9 is preferably 0.5 μm and is more preferably 0.4 μm. In a case in which the average thickness of the tin copper alloy layer 9 is less than the lower limit, the tin plating layer 5 may be easily peeled off from the conductive pattern 2. On the other hand, in a case in which the average thickness of the tin copper alloy layer 9 exceeds the upper limit, the thickness of the pure tin layer 10 is relatively reduced, and thus bondability with an electronic component or the like by an eutectic reaction may become insufficient.

Figure 3:
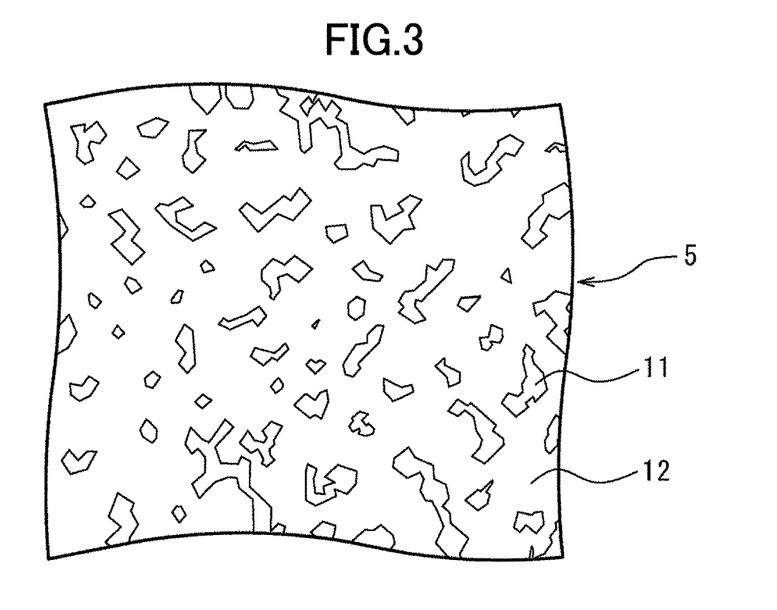
FIG. 3 is a schematic plan view of the tin plating layer of FIG. 1.

As illustrated in FIG. 3, on the outer surface of the tin plating layer 5, one or more first areas 11 (areas where the tin copper alloy layer 9 is exposed) formed by an alloy of a metal and tin forming the conductive pattern 2 and one or more second areas 12 (areas covered with the pure tin layer 10) formed by unalloyed tin may be formed. In the present embodiment, on the outer surface of the tin plating layer 5, a sea-island structure is formed such that the plurality of first areas 11 are scattered in the second area 12. Also, it is preferable that the plurality of the first areas 11 are arranged in the second area 12 at an approximately equal density. The first areas 11 are formed, for example, by alloying tin contained in the tin plating layer 5 with a metal such as copper constituting the conductive pattern 2 by a heat treatment in the manufacturing process of the printed circuit board.

The lower limit of the total occupying area percentage of the one or more first areas 11 in the outer surface of the tin plating layer 5 is preferably 2% and is more preferably 10%. On the other hand, the upper limit of the total occupying area percentage of the one or more first areas 11 in the outer surface of the tin plating layer 5 is preferably 90%, is more preferably 80%, and is further more preferably 70%. In a case in which the total occupying area percentage of the one or more first areas 11 in the outer surface of the tin plating layer 5 is less than the lower limit, the amount of brazing material formed by an eutectic reaction at the time of bonding with a terminal of an electronic component or the like increases, and thus a short circuit may occur at the adjacent connection portion 6. On the other hand, in a case in which the total occupying area percentage of the one or more first areas 11 in the outer surface of the tin plating layer 5 exceeds the upper limit, the amount of brazing material generated by an eutectic reaction becomes insufficient, and the bonding with a terminal of an electronic component or the like may become insufficient.

The lower limit of the average thickness of the second area 12 (the average value of thicknesses of all second areas 12 formed on the outer surface of the tin plating layer 5) is preferably 0.05 μm and is more preferably 0.10 μm. On the other hand, the upper limit of the average thickness of the second area 12 is preferably 0.4 μm and is more preferably 0.3 μm. In case in which the average thickness of the second area 12 is less than the lower limit, the amount of brazing material formed by an eutectic reaction becomes insufficient, and the bonding with a terminal of an electronic component or the like may become insufficient. On the other hand, in a case in which the average thickness of the second area 12 exceeds the upper limit, the amount of brazing material formed at the time of bonding with a terminal of an electronic component or the like increases, and thus a short circuit may occur at the adjacent connection portion 6.

<Method of Manufacturing Printed Circuit Board>

Figure 4:
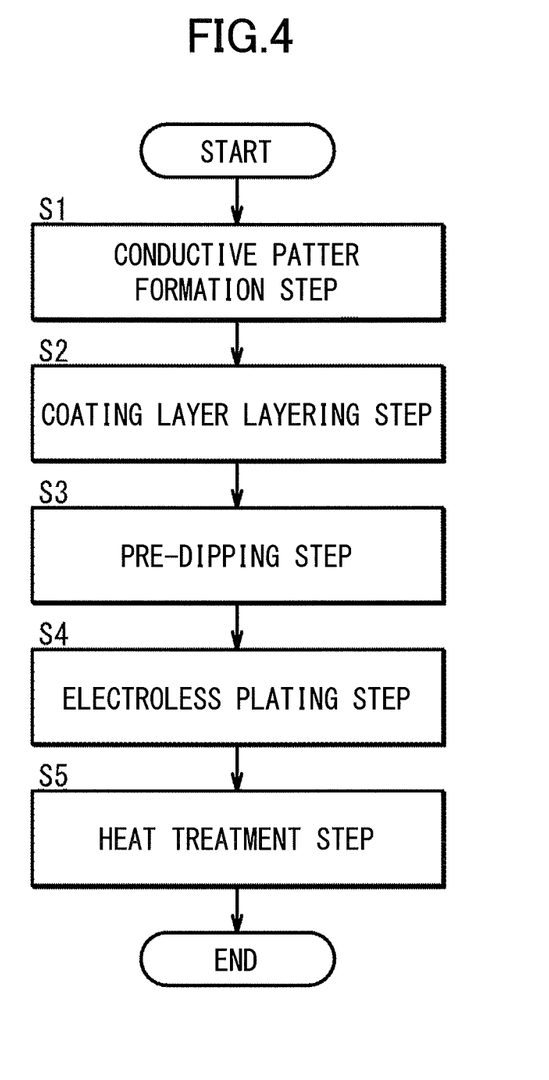
FIG. 4 is a flowchart illustrating steps of manufacturing the printed circuit board of FIG. 1.

The printed circuit board of FIG. 1 can be manufactured by a method of manufacturing a printed circuit board illustrated in FIG. 4. The method of manufacturing a printed circuit board of FIG. 4 is itself one embodiment of the present invention.

The method of manufacturing a printed circuit board includes: a conductive patter formation step of forming a conductive pattern 2 partially on a surface side of an insulating base film 1 <Step S1>; a coating layer layering step of layering, on a surface of a layered structure including the base film 1 and the conductive pattern 2, a coating layer 4 having an opening portion that partially exposes the conductive pattern 2 <Step S2>; and a pre-dipping step of immersing a layered structure including the base film 1, the conductive pattern 2, and the coating layer 4 in a room temperature electroless tin plating solution <Step S3>; and an electroless plating step of immersing the layered structure including the base film 1, the conductive pattern 2, and the coating layer 4 in a heated electroless tin plating solution <Step S4>. Further, it is preferable that the method of manufacturing the printed circuit board further includes a heat treatment step <Step S5> of applying a heat treatment to the layered structure after the electroless plating step.

<Conduction Pattern Formation Step>

In the conductive pattern formation step of step S1, the conductive pattern 2 is formed on the surface of the base film 1 by a known method such as a subtractive method or a semi-additive method, for example.

In a typical subtractive method, a metal layer is layered on the front and back surfaces of the base film 1 by, for example, adhesion of a metal foil, deposition of a metal, sintering of metal fine particles, metal plating, or the like, and a resist pattern is formed over a portion corresponding to a desired conductive pattern 2 of the metal layer and etched to form the conductive pattern 2.

Also, in a typical semi-additive method, a thin seed layer is formed on the front and back surfaces of the base film 1 by, for example, vapor deposition of a metal, sintering of fine metal particles, electroless metal plating, or the like, a resist pattern opening at a portion corresponding to a desired conductive pattern 2 is formed on the surface of the seed layer, and the conductive pattern 2 is formed by electroplating the seed layer exposed in the opening of the resist pattern.

<Coating Layer Layering Step>

In the coating layer layering step of Step S2, a coverlay, a solder resist, and the like is layered by a known method.

<Pre-Dipping Step>

In the pre-dipping step of Step S3, by replacing water and foreign matter adhering to the surface of the conductive pattern 2 exposed from the opening portion 3 portion by a room temperature electroless tin plating solution, that is, by an electroless tin plating solution in which the activity of the plating reaction is sufficiently low, the variation of plating in the subsequent electroless plating step is suppressed.

<Electroless Plating Step>

In the electroless plating step of Step S4, the layered structure including the base film 1, the conductive pattern 2, and the coating layer 4 is immersed in the electroless tin plating solution in which the plating reaction is activated by being heated, and tin is layered on the surface of the conductive pattern 2 exposed from the opening portion 3.

As the electroless plating solution, it is possible to use an acidic-group substituted electroless tin plating solution containing an acid that lowers the pH, tin ions, and a complexing agent that decreases the redox potential of copper to lower than the redox potential of tin. Also, it is preferable that the acidic-group substituted electroless tin plating solution further contains, for example, an antioxidant, a surfactant, and the like.

The lower limit of the heated temperature of the electroless plating solution is preferably 50° C. and is more preferably 55° C. On the other hand, the upper limit of the heated temperature of the electroless plating solution is preferably 70° C. and is more preferably 65° C. In a case in which the heated temperature of the electroless plating solution is less than the lower limit, the plating reaction may become insufficient. On the other hand, in a case in which the heated temperature of the electroless plating solution exceeds the upper limit, the thickness of the tin plating layer 5 to be formed may not be easily adjusted.

The lower limit of the immersion time in the electroless plating solution is preferably 1 minute and is more preferably 2 minutes. On the other hand, the upper limit of the immersion time in the electroless plating solution is preferably 30 minutes and is more preferably 20 minutes. In case in which the immersion time in the electroless plating solution is less than the lower limit, the tin plating layer 5 with a sufficient thickness may not be formed. On the other hand, in a case in which the immersion time in the electroless plating solution exceeds the upper limit, the erosion of the conductive pattern 2 due to local cell action may not be sufficiently prevented.

<Heat Treatment Step>

In the heat treatment step of Step S5, generation of whiskers in the tin plating layer 5 is suppressed by applying a heat treatment to the layered structure after the electroless plating step.

The heat treatment temperature of the heat treatment step can be, for example, greater than or equal to 100° C. and less than or equal to 140° C. Also, the heat treatment time of the heat treatment step can be, for example, greater than or equal to one hour and less than or equal to three hours. It should be noted that in case in which a heat treatment is performed under the above described heat treatment conditions, the average thickness of one or more second areas 12 from the outer surface of the tin plating layer 5 is decreased in a range of approximately 0.1 μm or more and 0.4 μm or less. Therefore, in the step of immersing in the electroless tin plating solution described above, the immersion time is adjusted so as to form the tin plating layer 5 having a thickness in consideration of the decreased amount in advance.

<Advantageous>

According to the printed circuit board, by having a small average peel length of the coating layer 4 from the conductive pattern 2 with an inner edge of the opening portion 3 as a base end, corrosion of the conductive pattern 2 due to local cell action at the time of forming the tin plating layer 5 can be suppressed and therefore, disconnection of the conductive pattern 2 does not easily occur.

Also, according to the method of manufacturing a printed circuit board, by including the pre-dipping step of Step S3, it is possible to promote the layering of tin on the conductive pattern 2 in the electroless plating step of Step S4. As a result, because corrosion of the conductive pattern 2 due to local cell action can be suppressed, the method of manufacturing a printed circuit board enables to manufacture a printed circuit board such that disconnection of the conductive pattern 2 does not easily occur.

Other Embodiments

The embodiments disclosed above should be considered exemplary in all respects and not limiting. The scope of the present invention is not limited to configurations of the above described embodiments, but is indicated by claims and is intended to include all changes within the meaning and scope of equivalence with the claims.

The printed circuit boards are not limited to those manufactured by the method of a manufacturing printed circuit boards according to the above described embodiment.

The printed circuit board may be a double-sided circuit board with a conductive pattern on both surfaces of a base film, or may be a multi-layered circuit board in which a base film and a conductive pattern are further layered on a double-sided circuit board.

The method of manufacturing a printed circuit board may further include, prior to the pre-dipping step, a step of washing the layered structure of the base film, the conductive pattern, and the coating layer, a soft etching step, an acid pickling step, and the like.

EXAMPLES

Although the present invention will be described in detail with reference to Examples, the present invention is not limited to the description of Examples.

[No. 1]

(Printed Circuit board)

A base film having a polyimide as the main component and having an average thickness of 25 μm was prepared. On one side surface of the base film, as a conductive pattern, electrode bodies made of a copper foil having an average width of 25 μm and linear in a plan view were layered in parallel at an average interval of 25 μm. Subsequently, a coverlay was layered on a portion of a layered structure of the base film and the electrode bodies and a solder resist was layered on a different portion of the layered structure. For each of the coverlay and the solder resist, one with an opening to expose the electrode bodies is used. A pre-dipping step was performed to immerse the layered structure including the base film, the electrodes, the coverlay and the coating layer of the solder resist in a room temperature electroless tin plating solution. Immediately after this pre-dipping step, an electroless plating step was performed to immerse it in a heated electroless tin plating. The immersion time in the electroless plating step was adjusted so that the thickness of the formed tin plating layer was 0.2 μm. Further, to the layered structure of the base film, the electrode bodies, and the tin plating layer after electroless plating, a heat treatment step for suppressing generation of whiskers was applied to manufacture a printed circuit board No. 1. In the heat treatment step, the heat treatment temperature was 100° C. and the heat treatment time was 1 hour.

In the obtained printed circuit board No. 1, a tin copper alloy layer in which the copper of the conductive pattern and the tin of the tin plating layer were alloyed by the heat treatment and an unalloyed pure tin layer were formed, and on the outer surface of the tin plating layer, a plurality of first areas formed by the tin copper alloy and one continuous second area formed by the unalloyed tin were present. That is, on the outer surface of the tin plating layer, a sea-island structure in which the plurality of first areas were scattered in the second area was formed.

[No. 2]

With the exception that the immersion time in the electroless plating step was adjusted so that the thickness of the tin plating layer was 0.3 and the heat treatment temperature in the heat treatment step was 120° C., by a manufacturing method similar to that of the printed circuit board No. 1, a printed circuit board No. 2 was manufactured. The printed circuit board No. 2 had, similar to the printed circuit board No. 1, a sea-island structure in which the plurality of first areas were scattered in the continuous second area on the outer surface of the tin plating layer.

[No. 3]

With the exception that the immersion time in the electroless plating step was adjusted so that the thickness of the tin plating layer was 0.4 μm, the heat treatment temperature in the heat treatment step was 120° C., and the heat treatment time was two hours, by a manufacturing method similar to that of the printed circuit board No. 1, a printed circuit board No. 3 was manufactured. The printed circuit board No. 3 had, similar to the printed circuit board No. 1, a sea-island structure in which the plurality of first areas were scattered in the continuous second area on the outer surface of the tin plating layer.

[No. 4]

With the exception that the immersion time in the electroless plating step was adjusted so that the thickness of the tin plating layer was 0.6 μm, the heat treatment temperature in the heat treatment step was 120° C., and the heat treatment time was two hours, by a manufacturing method similar to that of the printed circuit board No. 1, a printed circuit board No. 4 was manufactured. The printed circuit board No. 4 had, similar to the printed circuit board No. 1, a sea-island structure in which the plurality of first areas were scattered in the continuous second area on the outer surface of the tin plating layer.

[No. 5]

With the exception that the immersion time in the electroless plating step was adjusted so that the thickness of the tin plating layer was 0.1 μm, by a manufacturing method similar to that of the printed circuit board No. 1, a printed circuit board No. 5 was manufactured. In contrast to the printed circuit board No. 1, the printed circuit board No. 6 had a sea-island structure in which the plurality of second areas were scattered in the continuous first area on the outer surface of the tin plating layer.

[No. 6]

With the exception that the pre-dipping step was omitted, by a manufacturing method similar to that of the printed circuit board No. 1, a printed circuit board No. 6 was manufactured. The printed circuit board No. 6 had, similar to the printed circuit board No. 1, a sea-island structure in which the plurality of first areas were scattered in the continuous second area on the outer surface of the tin plating layer.

[No. 7]

With the exception that the immersion time in the electroless plating step was adjusted so that the thickness of the tin plating layer was 0.7 μm, the heat treatment temperature in the heat treatment step was 120° C., and the heat treatment time was two hours, by a manufacturing method similar to that of the printed circuit board No. 1, a printed circuit board No. 7 was manufactured. The printed circuit board No. 7 had, similar to the printed circuit board No. 1, a sea-island structure in which the plurality of first areas were scattered in the continuous second area on the outer surface of the tin plating layer.

[No. 8]

With the exception that the immersion time in the electroless plating step was adjusted so that the thickness of the tin plating layer was 0.1 μm and the heat treatment step was omitted, by a manufacturing method similar to that of the printed circuit board No. 1, a printed circuit board No. 8 was manufactured. In the printed circuit board No. 8, the entire outer surface of the tin plating layer was covered by the unalloyed pure tin layer (second area).

[No. 9]

With the exception that the immersion time in the electroless plating step was adjusted so that the thickness of the tin plating layer was 0.4 μm and the heat treatment step was omitted, by a manufacturing method similar to that of the printed circuit board No. 1, a printed circuit board No. 9 was manufactured. In the printed circuit board No. 9, the entire outer surface of the tin plating layer was covered by the unalloyed pure tin layer (second area).

For each of the printed circuit boards No. 1 to No. 9, the average thickness of the tin plating layer and the average thickness of the pure tin layer were measured and the average thickness of the tin copper alloy layer was calculated. Also, for each of the printed circuit boards No. 1 to 9, the total occupying area percentage of one or more first areas in the outer surface of the tin plating layer was measured.

<Average Thickness of Tin Plating Layer>

The average thickness of the tin plating layer was measured using a fluorescent X-ray analyzer ("SFT9300" manufactured by Hitachi High-Technologies Corporation).

<Average Thickness of Pure Tin Layer>

The average thickness of the pure tin layer (the average distance from the outer surface of the tin plating layer to the surface of the tin copper alloy layer) was measured using an electrolytic thickness tester ("GCT-311" manufactured by Densoku Instruments Co., Ltd).

<Average Thickness of Tin Copper Alloy Layer>

The average thickness of the tin copper alloy layer was determined by subtracting the average thickness of the pure tin layer from the average thickness of the tin plating layer.

<Total Occupying Area Percentage of First Areas>

The outer surface of the tin plated layer was imaged using an energy-dispersive X-ray (EDX) analyzer ("QUANTAX FlatQUAD" manufactured by Bruker Corporation) at a magnification of 5000 times to measure the total occupying area percentage of the first areas in the outer surface of the tin plated layer.

Table 1 below indicates, for each of the printed circuit boards No. 1 to No. 9, the features of the manufacturing method, the average thickness of the tin plated layer, the average thickness of the pure tin layer, the average thickness of the tin copper alloy layer, and the total occupying area percentage of the first areas.

TABLE 1

| | PRE-DIPPING STEP | AVERAGE THICKNESS OF TIN PLATING LAYER [μm] | HEAT TREATMENT CONDITION AFTER PLATING | | AVERAGE THICKNESS OF TIN COPPER ALLOY LAYER [μm] | AVERAGE THICKNESS OF PURE TIN LAYER [μm] | TOTAL OCCUPYING AREA PERCENTAGE OF FIRST AREAS [%] |
|---|---|---|---|---|---|---|---|
| | | | TEMPERATURE [° C.] | TIME [h] | | | |
| No. 1 | CONDUCTED | 0.2 | 100 | 1 | 0.10 | 0.10 | 38.60 |
| No. 2 | CONDUCTED | 0.3 | 120 | 1 | 0.10 | 0.20 | 26.60 |
| No. 3 | CONDUCTED | 0.4 | 120 | 2 | 0.20 | 0.20 | 25.30 |
| No. 4 | CONDUCTED | 0.6 | 120 | 2 | 0.20 | 0.40 | 1.80 |
| No. 5 | CONDUCTED | 0.1 | 100 | 1 | 0.08 | 0.02 | 95.00 |
| No. 6 | NOT CONDUCTED | 0.2 | 100 | 1 | 0.10 | 0.10 | 42.50 |
| No. 7 | CONDUCTED | 0.7 | 120 | 2 | 0.20 | 0.50 | 0.30 |
| No. 8 | CONDUCTED | 0.1 | NO HEAT TREATMENT | | 0.00 | 0.10 | 0.00 |
| No. 9 | CONDUCTED | 0.4 | NO HEAT TREATMENT | | 0.00 | 0.40 | 0.00 |

<Average Peel Length>

For each of the printed circuit boards No. 1 to No. 9, a cross section of the layers of the coverlay and the solder resist cut at the opening portion was imaged using the above energy-dispersive X-ray analyzer at a magnification of 2000 times to measure the average peel length from the electrodes (conductive pattern) of the coverlay and the solder resist with the inner edge of the opening portion as a base end.

<Eutectic Bonding>

On the surface of a substrate having silicon as the main component and having an average thickness of 200 μm, electrodes made of gold foil and having an average thickness of 30 μm and having the same width as the electrodes of the printed circuit boards No. 1 to No. 9 were layered in parallel at the same interval with the electrodes of the printed circuit boards, so that a test material simulating an electronic component was prepared. This test material was arranged so that the electrodes faced on the printed circuit boards No. 1 to No. 9, and by hot pressing under the conditions of a temperature of 400° C., a pressure of 20 MPaG, and a time of 5 seconds, a connector obtained by connecting the test material to the printed circuit board was manufactured. For the connector of these, cross sections at ten locations, including the connection portions between the electrodes of the test material and the printed circuit board, were imaged using an energy-dispersive X-ray analyzer at a magnification of 5000 times to determine the number of connection portions (the number of eutectic bondings) where gold-tin eutectic bonding occurred.

<Whisker>

Each of the printed circuit boards No. 1 to No. 9 was left at 35° C. and 80% humidity for 1 week, and the terminal surface to which electroless tin plating was applied was imaged with a scanning electron microscope (SEM) "TM3030" manufactured by Hitachi High-Technologies Corporation at a magnification of 1000 times to determine the presence/absence of generation of whiskers of 2 μm or more on the surface.

Table 2 below indicates, for each of the printed circuit boards No. 1 to No. 9, the average peel length of the coverlay and the solder resist from the electrodes, the number of eutectic bondings (the number of eutectic bondings in ten locations), and the presence/absence of generation of whiskers (A indicates that no whisker was generated, and B indicates that whiskers were generated).

TABLE 2

| | AVERAGE PEEL LENGTH [μm] | | EUTECTIC BONDING NUMBER | WHISKER GENERATION |
|---|---|---|---|---|
| | COVER LAYER | SOLDER RESIST | | |
| No. 1 | 0 | 0 | 10/10 | A |
| No. 2 | 0 | 0 | 10/10 | A |
| No. 3 | 3 | 2 | 10/10 | A |
| No. 4 | 13 | 11 | 10/10 | A |
| No. 5 | 2 | 2 | 0/10 | A |
| No. 6 | 21 | 18 | 10/10 | A |
| No. 7 | 35 | 32 | 10/10 | A |
| No. 8 | 0 | 0 | 10/10 | B |
| No. 9 | 3 | 2 | 10/10 | B |

[Evaluation Results]

As indicated in Table 2, for each of the printed circuit boards No. 1 to No. 4, the average peel length was less than or equal to 20 the electrodes of the printed circuit board and the electrodes of the electronic component were eutectic-bonded, and whiskers did not occur. In contrast, for No. 5, because the average thickness of the second area was thin and the total occupying area percentage of first areas was too high, the formation amount of brazing material used for bonding with the electronic component was insufficient, and the electrodes of the printed circuit board and the electrodes of the electronic component were not eutectic-bonded. As a result, the bond strength between the printed circuit board No. 5 and the electronic component was insufficient. Also, for the printed circuit board No. 6, because the pre-dipping step was not performed prior to the electroless plating, the average peel length with respect to the coverlay exceeded 20 μm, and disconnection of the conductive pattern easily occurs. For the printed circuit board No. 7, although the pre-dipping step was performed, because the average thickness of the tin plating layer was greater than 0.6 μm and was too thick, the average peel length with respect to both the coverlay and the solder resist exceeded 20 μm. Also, for No. 8 to No. 9, although a problem of the average peel length and eutectic bonding was not found, because the heat treatment was not performed after the electroless plating step, generation of a large number of whiskers was confirmed on the tin plating surface and the possibility of a short circuit increased.

DESCRIPTION OF THE REFERENCE NUMERALS

1: base film, 2: conductivity pattern, 3: opening portion, 4: coating layer, 5: tin plating layer, 6: connection portion, 7: protective film, 8: adhesive layer 9: tin copper alloy layer, 10: pure tin layer, 11: first area, 12: second area, D: peel length, S1: conductive patter formation step, S2: coating layer layering step, s3: pre-dipping step, s4: electroless plating step, s5: heat treatment step

The invention claimed is:

1. A printed circuit board comprising:
an insulating base film;
a conductive pattern that is partially layered on a surface side of the base film;
a coating layer that is layered on a surface of a layered structure including the base film and the conductive pattern and having an opening portion that partially exposes the conductive pattern; and
a tin plating layer that is layered on a surface of the conductive pattern exposed from the opening portion,
wherein an average peel length of the coating layer from the conductive pattern with an inner edge of the opening portion as a base end is less than or equal to 20 μm,
wherein an average thickness of the tin plating layer is less than or equal to 0.6 μm,
wherein on an outer surface of the tin plating layer, one or more first areas formed by a tin alloy and one or more second areas formed by unalloyed tin are provided, and
wherein a total occupying area percentage of the one or more first areas in the surface of the tin plating layer is less than or equal to 90%.

2. The printed circuit board according, to claim 1,
wherein a main component of the conductive pattern is copper,
wherein the printed circuit board includes a tin copper alloy layer in which the copper of the conductive pattern is alloyed with tin of the tin plating layer, and
wherein an average thickness of the tin copper alloy layer is greater than or equal to 0.1 μm and less than or equal to 0.5 μm.

3. A method of manufacturing a printed circuit board comprising:
forming a conductive pattern partially on a surface side of an insulating base film;
layering, on a surface of a layered structure including the base film and the conductive pattern, a coating layer having an opening portion that partially exposes the conductive pattern;
immersing a layered structure including the base film, the conductive pattern, and the coating layer in a room temperature electroless tin plating solution at a temperature greater than or equal to 0° C. and less than or equal to 45° C.; and
immersing the layered structure including the base film, the conductive pattern, and the coating layer in a heated electroless tin plating solution at a temperature greater than or equal to 50° C.

* * * * *